United States Patent [19]
Agarwal

[11] Patent Number: 5,854,752
[45] Date of Patent: Dec. 29, 1998

[54] CIRCUIT PARTITIONING TECHNIQUE FOR USE WITH MULTIPLEXED INTER-CONNECTIONS

[75] Inventor: Anant Agarwal, Framingham, Mass.

[73] Assignee: IKOS Systems, Inc., North Waltham, Mass.

[21] Appl. No.: 588,649

[22] Filed: Jan. 19, 1996

[51] Int. Cl.$^6$ .............................. G06F 17/50; G06F 9/455
[52] U.S. Cl. .......................... 364/489; 364/490; 364/491; 364/578
[58] Field of Search .................................... 364/488–491, 364/578; 395/500

[56] References Cited

U.S. PATENT DOCUMENTS

| | | | |
|---|---|---|---|
| 5,036,473 | 7/1991 | Butts et al. ............................... | 364/489 |
| 5,229,953 | 7/1993 | Isozaki et al. ........................... | 364/490 |
| 5,495,419 | 2/1996 | Rostoker et al. ........................ | 364/468 |
| 5,513,124 | 4/1996 | Trimberger et al. ..................... | 364/491 |
| 5,596,742 | 1/1997 | Agarwal et al. ......................... | 395/500 |

OTHER PUBLICATIONS

"VirtualWires™: A Technology for Massive Multi–FPGA Systems", by Anant Agarwal, Virtual Machine Works, Inc., Feb. 1995, pp. 1–24.

Roy et al. ("A Timing–Driven Partitioning System for Multiple FPGAs", Overseas Publishers Association, VLSI Design, vol. 4, No. 4, 1 Jan. 1996, pp. 309–328).

Babb et al. ("Virtual wires: overcoming pin limitations in FPGA–based logic emulators", IEEE Comput. Soc. Press, Proceedings IEEE Workshop on FPGAs for Custom Computing Machines, 5 Apr. 1993, pp. 142–151).

Dahl et al. ("Emulation of the Sparcle microprocessor with the MIT Virtual Wires emulation system", IEEE Comput. Soc. Press, Proceedings IEEE Workshop on FPGAs for Custom Computing Machines, 10 Apr. 1994, pp. 14–22).

Brasen et al. ("FPGA partitioning for critical paths", IEEE Comput. Soc. Press, Proceedings of the European Design and Test Conference: The European Conference on Design Automation, 28 Feb. 1994, pp. 99–103).

Park et al. ("Verical partitioning of row–based circuits with minimal net–crossings", IEEE, 1991 IEEE International Symposium on Circuits and Systems, 11 Jun. 1991, vol. 4, pp. 2032–2035).

Yang et al. ("Circuit clusterings for delay minimization under are and pin constraints", IEEE Comput. Soc. Press, Proceedings of the European Design and Test Conference, 6 Mar. 1995, pp. 65–70).

Kim et al. ("Combined hierarchical placement algorithm for row–based layouts", Electronics Letters, vol. 29, Issue 17, 19 Aug. 1993, pp. 1508–1510).

*Primary Examiner*—Emanuel Todd Voeltz
*Assistant Examiner*—Phallaka Kik
*Attorney, Agent, or Firm*—Skjerven, Morrill, MacPherson, Franklin & Friel LLP; Edward C. Kwok

[57] ABSTRACT

A method for partitioning a logic circuit is provided for emulation under a virtual wires method using programmable logic devices. Because a virtual wires systems replace pin constraints by a corresponding gate constraint, partitioning for a virtual wires system applies novel constraints and algorithms. In one embodiment, partitioning is provided under a "flat mincut" approach in conjunction with a virtual wire cost constraint. In another embodiment, partitioning is provided under a "hierarchical mincut" in conjunction with a virtual wire cost constraint.

22 Claims, 11 Drawing Sheets

CIRCUIT PARTITIONING TECHNIQUE FOR USE WITH MULTIPLEXED INTER-CONNECTIONS

BACKGROUND OF THE INVENTION

1. Field of the Invention

The present invention relates to emulating a logic circuit using a set of programmable logic devices. In particular, the present invention relates to an automatic method for taking a logic circuit expressed in a logic design language and automatically mapping the logic circuit onto one or more programmable logic devices.

2. Discussion of the Related Art

In carrying out an emulation of a logic circuit using programmable logic devices, it is often necessary to partition the logic circuit into a number of smaller logic circuits, so that each of these smaller logic circuits can fit into one such programmable logic devices. The partitioning step is typically performed automatically by a partitioner software whose goal is to split the input logic circuit into as few a set of logic blocks as possible, while adhering to some imposed constraints ("partitioner's constraints"). This process is most commonly accomplished by partitioning a gate-level netlist representation of the logic circuit to be emulated, and assigning each resulting partition (called "block") to a programmable logic device to be implemented. A popular programmable logic device which is often used in logic emulation applications is the field programmable gate array ("FPGA"). Of course, partitioning can also be applied to other representations of the logic circuit, such as register-transfer level or behavioral level representations.

Figure 1A:
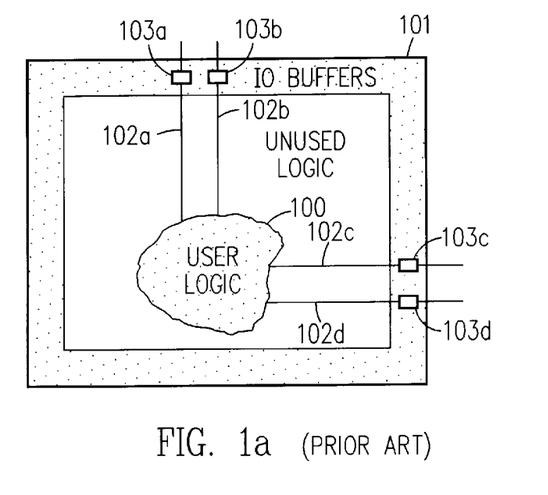
FIG. 1a shows an implementation of a logic circuit in a conventional logic emulation application using an FPGA.

In a conventional logic emulation system, each block is mapped without modification of the logic circuit onto the programmable logic device. FIG. 1a shows, in a conventional logic circuit emulation, a logic block 100 having output signals 102a, 102b, 102c and 102d implemented in the programmable logic gates of FPGA 101. FIG. 1a represents, schematically, a pin-limited condition in which a logic block having more input/output signals than block 100 cannot be placed in FPGA 101 because output signals 102a, 102b, 102c, and 102d, which are assigned input/output terminals ("pins") 103a, 103b, 103c and 103d have exhausted the available input/output pins of FPGA 101, even though FPGA 101 may have a large number of logic gates that are unused. This condition leads to a low utilization rate of logic gates in the FPGAs.

Suppose $G_{max}$ and $P_{max}$ are the number of available logic gates of FPGA 101 and the number of available pins of FPGA 101, respectively, the conventional partition constraints are:

$$G_i \leq G_{max}; P_i \leq P_{max}$$

where $G_i$ and $P_i$ are, respectively, the number of logic gates and the number of pins of block i, that are assigned to FPGA 101.

Figure 2A:
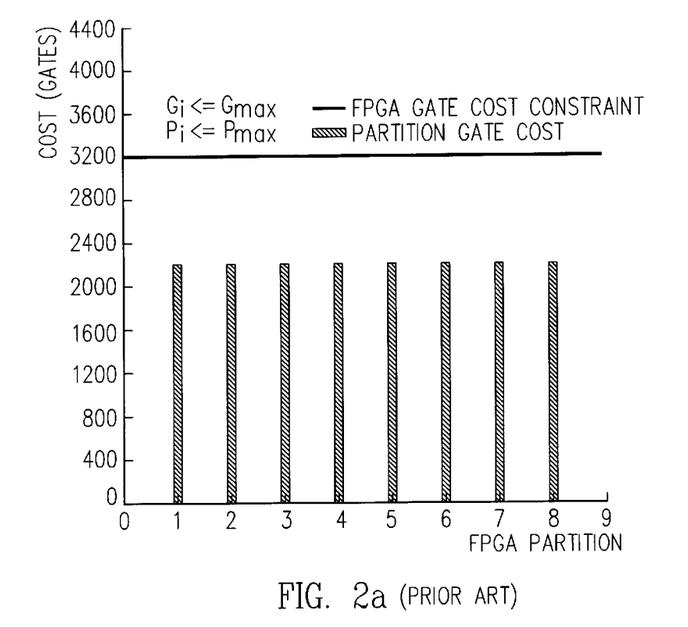
FIG. 2a shows the logic gate count of an 8-way partition of a logic circuit "Sparcle".
Figure 2B:
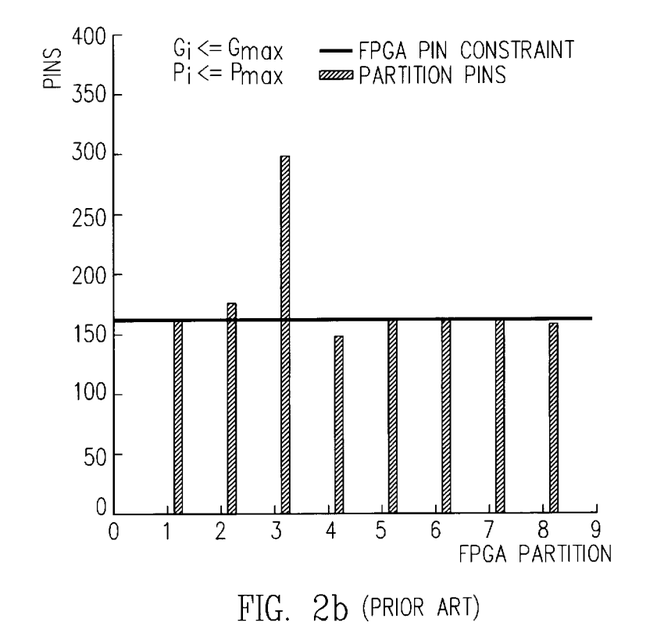

FIGS. 2a and 2b show, respectively, the logic gate count and the pin count of each block in one 8-way partition of a logic circuit "Sparcle". As shown in FIG. 2a, under this 8-way partition, each block requires approximately 2200 logic gates. All eight blocks of the 8-way partition thus satisfy the FPGA's logic gate constraint of 3200 logic gates. However, as shown in FIG. 2b, the FPGA's pin constraint of 160 pins is violated in both block 2, which requires approximately 170 pins, and block 3, which requires close to 300 pins.

Figure 2C:
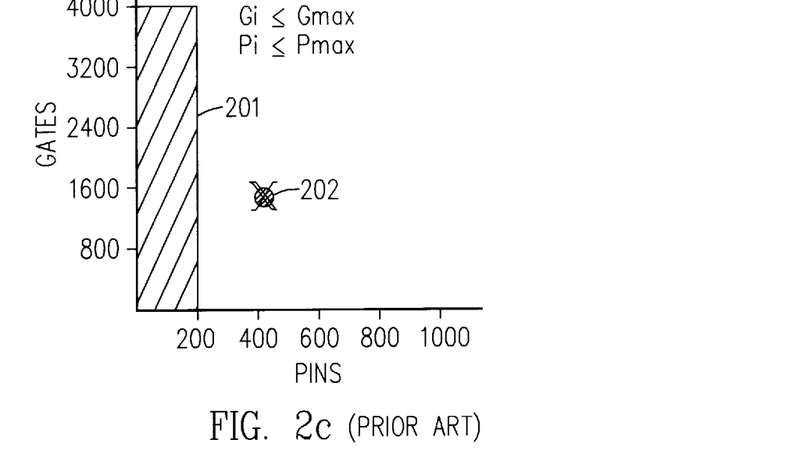
FIG. 2c shows the partitioner's constraint space for an FPGA having 4000 logic gates and 200 pins.

FIG. 2c shows the partitioner's constraints for an FPGA having 4000 logic gates and 200 pins. Under a conventional emulation scheme, the shaded area 201 is the feasible partitioning region within which both the logic gate constraint and the pin constraint are met. A partition or block that falls at position 202 shown, for example, does not meet the partitioner's constraint for a conventional logic emulation application.

The examples of FIGS. 2a, 2b and 2c demonstrate that a conventional partitioning method, in order to satisfy the logic gate constraint, often requires some FPGAs to have a much larger pin count than others. In the partitioning process, it is relatively easy to control the number of logic gates in a partition or block, since partitioning neither introduces nor deletes logic gates from the logic circuit to be emulated. However, estimating the number of pins in a block before completion of the partitioning process is difficult. When the number of available FPGAs is fixed, at the later stages of a recursive partitioning, the partitioner may not be able to find an acceptable partition solution due to the inability to satisfy the pin constraints.

The same limitations extend to emulating logic circuits at the board level. In a typical conventional logic emulation system, a logic circuit can be implemented in multiple system boards, where each system board consists of a large number of FPGAs. There, the logic circuit that can be implemented on each system board is limited by both the constraints of the FPGAs (i.e. the number of gates and the number of pins in each of the FPGAs on the system), and the number of pins interconnecting system boards. For many applications, the pin constraint is so limiting that the resulting utilization rate of the total available logic gates in such a system is very low.

SUMMARY OF THE INVENTION

The present invention provides a method for partitioning a logic circuit for emulation by a preconfigured group of programmable logic devices, such as field programmable logic arrays (FPGAs). The partitioning step uses a single cost constraint which is a function of both the number of logic gates in the logic block and the number of pins in the logic block.

In one embodiment, the cost constraint applied compares a cost function to a maximum number of logic gates allowed for any block. The cost constraint ("combined cost constraint") is given by:

$$G_i + cP_i \leq G_{max}$$

where $G_i$ is the number of logic gates in the logic block, $G_{max}$ is the number of logic gates available in one such programmable logic device, c is a weighting factor expressing the cost of a pin in terms of a logic gate, and $P_i$ is the number of pins in the logic block. In another embodiment, the cost function assigns a different cost to input and output pins of a logic block. In that embodiment, the cost of an output pin is weighted by its fanout.

In another embodiment, when a pin carries a signal making multiple transitions within a reference clock period, the cost function assigns a cost to such a pin in proportion to the number of transitions it can make within the reference clock period.

In accordance with another aspect of the present invention, prior to partitioning the logic circuit, a step of preclustering is carried out. In one embodiment, the clusters are formed by applying a cost constraint which is a fraction of the combined cost constraint for partitioning, e.g. $G_{max}/10$. Prior to partitioning, a step of timing optimization can also be carried out. Such a step of timing optimization identifies critical signal paths in the logic circuit and groups logic elements in the critical path into logic modules having pins of minimized costs.

In accordance with another aspect of the present invention, the cost function for partitioning takes into consideration a concept of "virtual links". The cost function assigns a virtual link cost to a pin in proportion to the number of unique logic blocks the pin connects.

In accordance with another aspect of the present invention, to minimize the cost of an output pin with a large fanout, the logic circuit is restructured to minimize the number of fanouts in such an output pin, redistributing the task of driving the output signal to some of the blocks receiving the output signal.

In accordance with another aspect of the present invention, the cost function assigns different costs to logic gates, pins, memory components, and flip-flops. In one embodiment, the cost function assigns a higher cost to pins coupling the logic circuit to an external circuit.

In accordance with another aspect of the present invention, when a logic circuit includes a number of timing domains, the cost function assigns a different cost to a pin connecting logic elements of different timing domains than a pin connecting logic elements of the same timing domain.

In one embodiment of the present invention, partitioning is performed under a flat mincut algorithm. In another embodiment, partitioning is performed under a hierarchical mincut algorithm. In one variation of the hierarchical mincut algorithm, when the input logic circuit fails to satisfy a termination constraint, a flat mincut algorithm is attempted on the input logic circuit before a recursive application of the hierarchical mincut algorithm is applied to the constituent portions of the input logic circuit.

Because partitioning under the present invention uses a single constraint which takes into consideration at the same time both the number of gates in a logic block and the number of pins in the logic block, allowing a cost trade-off between logic gates for pins, and vice versa, the utilization rates in the FPGAs of the emulation "breadboard" are much higher those achieved under conventional emulation methods.

The present invention is better understood upon consideration of the detailed description below and the accompanying drawings.

BRIEF DESCRIPTION OF THE DRAWINGS

FIG. 2b shows the pin count in the same 8-way partition of the logic circuit "Sparcle" shown in FIG. 2a.

DETAILED DESCRIPTION OF THE PREFERRED EMBODIMENTS

The present invention takes advantage of a recent advance in logic emulation technology called the method of "virtual wire", which optimizes the scarce pin resources by multiplexing input/output signals on input/output pins. The method of virtual wires is disclosed in a copending patent application, entitled "Virtual Wires for Reconfigurable Logic Systems", Ser. No. 08/042,151, filed on Apr. 2, 1993, assigned to Virtual Machine Works, Inc., which is also the assignee of the present application. This copending patent application is hereby incorporated by reference to provide the technical background of the method of virtual wires.

In a virtual wire system, the pins of the FPGA can be multiplexed among multiple logic signals (hence the name "virtual wire"). The method of "virtual wire logic emulation" can be illustrated by the example of FIG. 4. Under the method of virtual wire logic emulation, a netlist representation of a logic circuit is provided, at step 401, to a transition analyzer which analyzes all clock signals of the logic circuit. As described below, a virtual wire method uses a "virtual clock" signal to multiplex the pins. The transition analyzer substitutes clock signals in the logic design with the virtual clock signal and other clock signals derived from the virtual clock signal.

Figure 4:
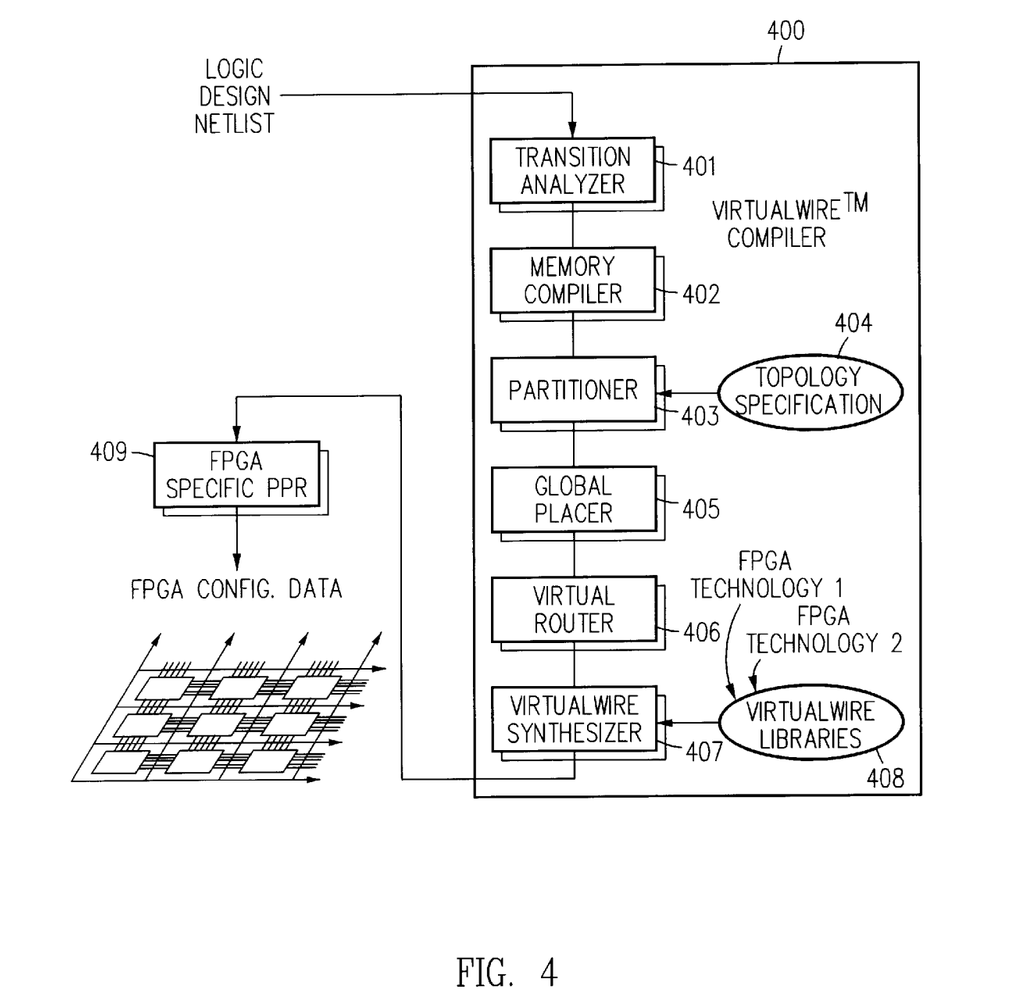
FIG. 4 illustrates the method of "virtual wire" logic emulation.

At step 402, the memory components of the logic circuit to be emulated is analyzed and optimized by a memory compiler. Specifically, the memory compiler matches the memory components of the logic circuit with a static random access memory (SRAM) available on the hardware emulator. At step 403, the remainder of the logic circuit is partitioned by a partitioning step, described in further detail below, according to a topological specification of the emulator. The topological specification of the emulator specifies how the FPGAs are physically interconnected on the emulator or "breadboard".

After completing the partitioning step at 402, a placer assigns the partitioned blocks to the FPGAs. A virtual router then, at step 406, schedules each input/output signal for the multiplexed FPGA pins. At step 407, a virtual wire synthesizer synthesizes additional logic elements and control circuits in each FPGA to allow input/output signals communicated across FPGA boundaries to share the multiplexed pins of the FPGAs. To synthesize these additional logic elements and control circuits, the virtual wire synthesizer uses a virtual wire component library which is designed to the FPGA technology of the emulator. Finally, at step 409, a vendor-specific configuration generator translates the final netlist into a configuration data file which can be used to program the emulator.

Figure 1B:
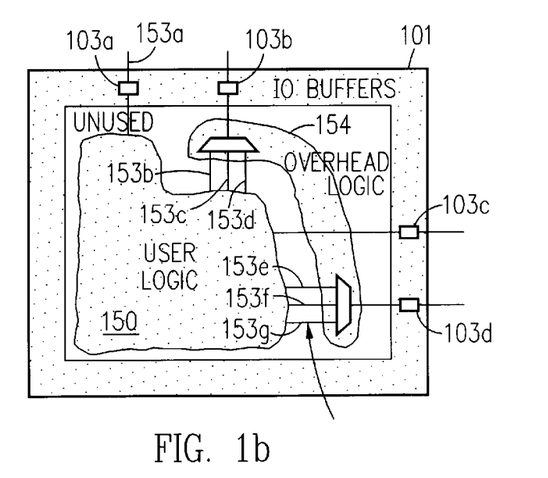
FIG. 1b shows an implementation of a logic circuit emulation using the method of "virtual wire".

The partitioning step 402 results in a block 150 illustrated in FIG. 1b, which is contrasted with block 100 of FIG. 1a under a conventional emulation system. In FIG. 1b, the virtual wire scheme allows a logic block 150 to be placed in FPGA 101, even though logic block 150 has both more logic gates and more input/output signals (i.e. signals 153a–153g) than block 100 of FIG. 1a. In FIG. 1b, the virtual wire compiler provides, as discussed above, additional logic elements 154, which is placed between logic block 150, to allow input/output signals 153a–153g to share the limited pin resources (i.e. pins 103a–103d) by multiplexing and scheduling. The virtual wire compiler automatically generates logic elements 154 for multiplexing and scheduling of input/output signals 153a–153g. Because logic elements 154 are not part of logic block 150, but are introduced by the virtual wire compiler, it is also referred to as "overhead logic".

As mentioned above, the virtual wire compiler generates in logic elements 154 a high speed clock signal, which is typically 2–100 times the speed of the user's clock signal, if any, clocking logic circuit 150. This additional clock signal, which is the virtual clock signal referenced above, controls multiplexing signals 153a–153g over pins 103a–103d.

A significant difference between a conventional emulation system, such as the system shown in FIG. 1a, and a virtual wire emulation system, such as the system shown in FIG. 1b, relates to their different partitioner's constraints. As discussed above, in a conventional emulation system, the logic circuit to be emulated is partitioned such that each block satisfies both a gate constraint and a pin constraint. By contrast, in a virtual wire emulation system, the partitioner is substantially relieved of the pin constraint. In a virtual wire system, the input/output terminals or pins of the FPGA can be multiplexed among multiple logic signals (hence the name "virtual wire"). As a trade-off, additional logic elements for implementing the virtual wires, e.g. logic elements 154, reduce the number of logic gates available in each FPGA. However, because the pin constraint is usually not limiting in a virtual wires emulation system, high utilization of the FPGAs can be achieved. The net result is a larger gate utilization in each FPGA than in the corresponding conventional emulation system discussed above.

The "Sparcle" logic circuit example of FIGS. 2a and 2b can also be used to illustrate partitioning under a virtual wire scheme. As is shown below, partitioning under a virtual wire scheme is a single constraint scheme. Let c denote the "cost" of a virtual wire expressed in gate-equivalents, i.e. the average number of overhead logic gates that is required to implement a single input/output logic signal that must be communicated outside of the FPGA (e.g. signal 153a–153f). For simplicity, we assume temporarily that both input pins and output pins cost the same. Typically, c is roughly four "gates"[1].

[1] The term "gate", when used in this description to denote cost, is a two-input NAND gate equivalent.

In a virtual wire system, the partitioner's constraint is given by:

$$G_i + cP_i \leq G_{max}$$

where the quantities $G_i$, $G_{max}$, and $P_i$ are the same as defined above. The terms $G_i$ and $cP_i$ are known as the "partition gate cost" and the "partition pin cost", respectively. The sum of the partition gate cost and the partition pin cost is known as the "virtualized partition gate cost" or the "combined cost constraint". FIG. 3b shows feasible partition region 203 under the partitioner's constraint for a virtual wire emulation scheme. Feasible partitioning region 201 of FIG. 2c, under a conventional partitioning scheme, is also shown in FIG. 3b, enclosed by the dotted lines, to allow comparison. As shown in FIG. 3, design 202, which violates the pin constraint under a conventional partition scheme, satisfies the virtual wire partitioner's constraint. As can be easily observed, because the pin constraint is now expressed as a portion of the gate constraint, the feasible partitioning space is much larger, and allows a much higher logic gate utilization rate in the FPGA. Under the virtual wire partitioner's constraint, logic gates can be traded for pins. If a given logic block has more pins than the other logic blocks, then the requirement of the higher number of pins is traded off for the available logic gates in the FPGA. The trade-off is illustrated by the downward sloping boundary of feasible partitioning region 203 of FIG. 3b. Such trade-off is not available under a conventional emulation scheme.

Figure 3A:
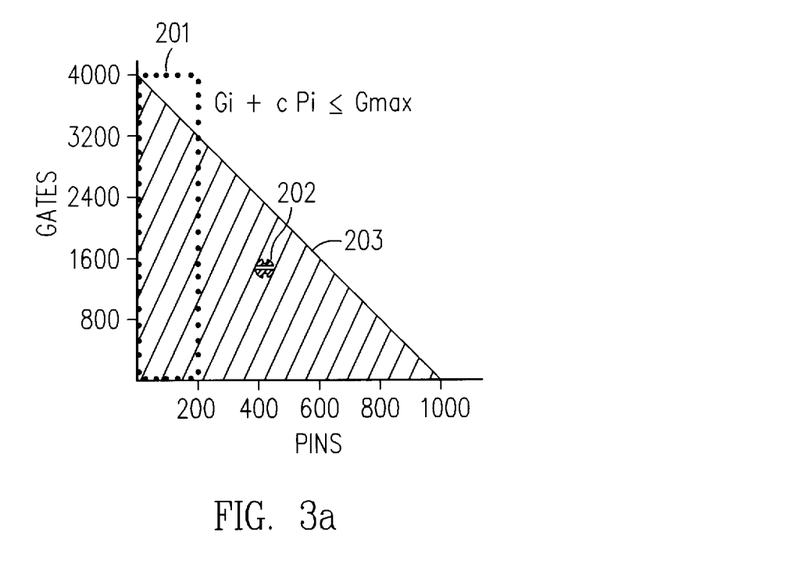
FIG. 3a shows feasible partitioning region 203 under the partitioner's constraint for a virtual wire emulation scheme.
Figure 3B:
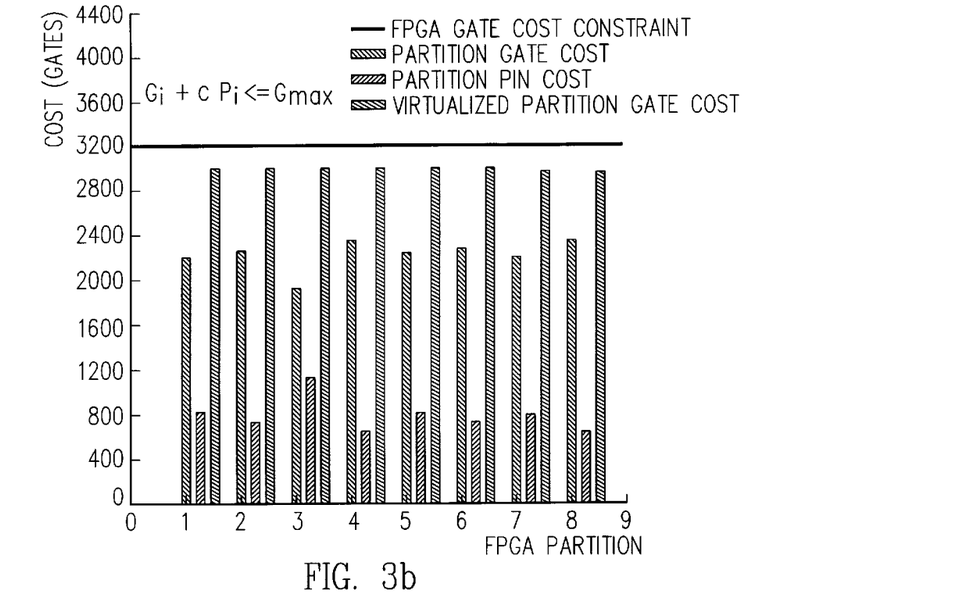
FIG. 3b shows, under a virtual wire partitioning scheme, the partition gate cost, the partition pin cost, and the virtualized partition gate cost for each of the resulting eight blocks of the logic circuit "Sparcle" used in the example of FIGS. 2a and 2b.

FIG. 3a shows the costs of implementing the 8-way partition of the "Sparcle" logic circuit illustrated in FIGS. 2a and 2b. FIG. 3a shows, under a virtual wire partitioning scheme, the partition gate cost, the partition pin cost, and the virtualized partition gate cost for each of the resulting eight blocks of the "Sparcle" logic circuit. The partitioner of the virtual wire scheme of FIG. 3a uses the virtualized wire cost as the partitioner's constraint. As can be seen from FIG. 3b, unlike the conventional partitioning scheme of FIGS. 2a and 2b, each of the eight blocks of the "Sparcle" logic circuit meets the FPGA gate constraint of 3200 logic gates. The virtualized gate cost for each of the eight blocks is substantially the same.

Figure 3C:
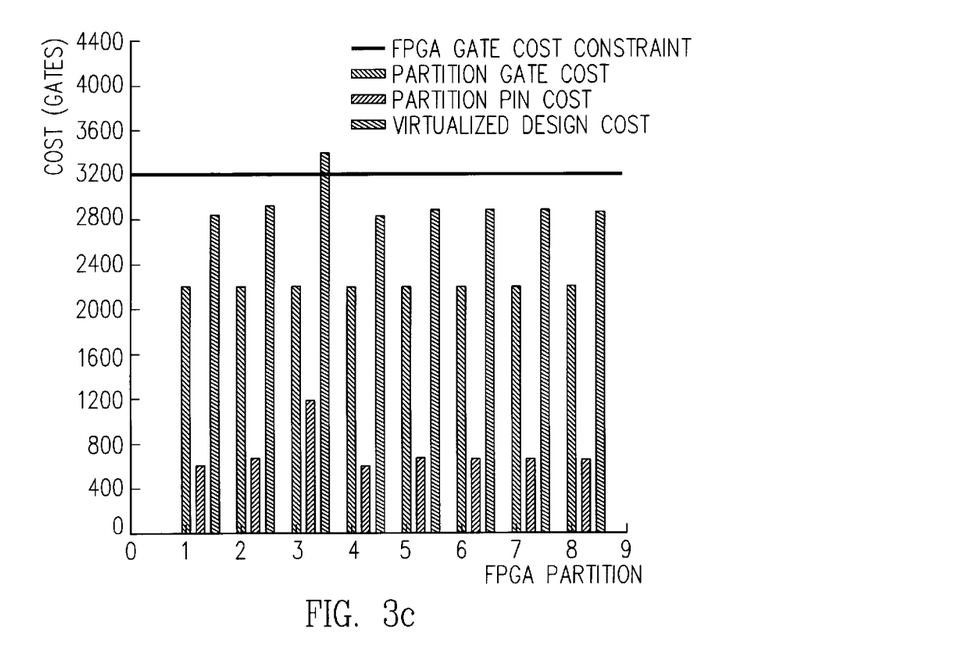
FIG. 3c shows an alternative partitioning of the "Sparcle" logic circuit under the virtual wire concept, using the partition gate cost as the partitioner's constraint.

FIG. 3c shows an alternative partitioning of the "Sparcle" logic circuit under the virtual wire scheme, using a partition gate cost as the partitioner's constraint (i.e. the partitioning pin cost is not considered). FIG. 3c shows the final virtualized gate costs for the resulting eight blocks to be uneven, and the final virtualized gate costs for block 2 violates the FPGA constraint of 3200 logic gates.

Partitioning steps for an exemplary embodiment of the present invention are provided next. Of course, these steps are included for exemplary purposes. Other partitioning steps can also be substituted within the scope of the present invention. The goal of the present partition steps is to minimize the number of blocks with the virtualized gate cost constraint. Additionally, the partitioner assigns modules to blocks in a manner that minimizes the number of interblock crossings in long combinational paths. The latter goal helps improve system speed.

Figure 5:
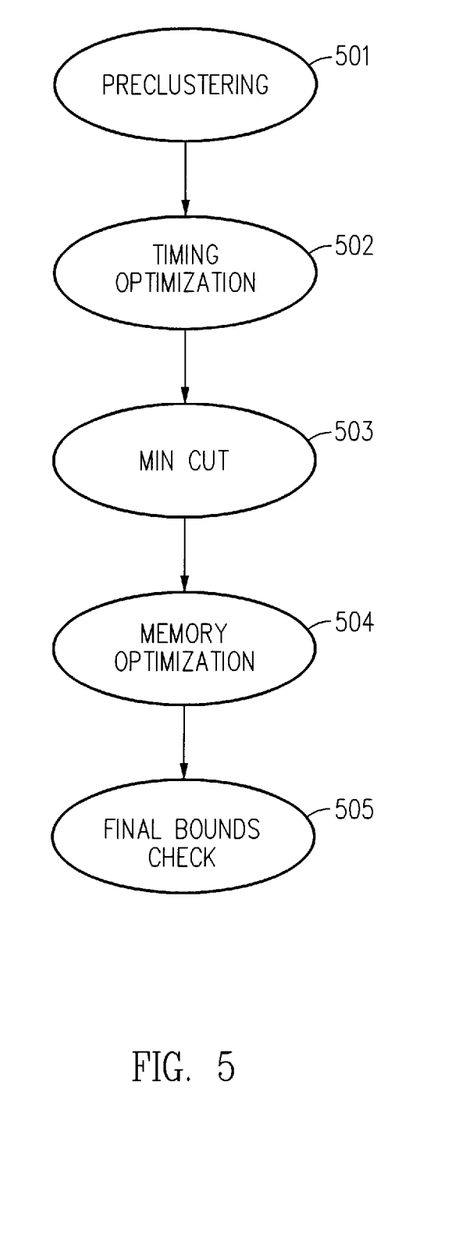
FIG. 5 is a flow diagram 500 showing the major steps 501–505 performed by a partitioner of the present invention.

FIG. 5 is a flow diagram 500 showing the major steps 501–505 performed by a partitioner of the present invention. As shown in FIG. 5, at step 501, the partitioner carries out a preclustering step. In the preclustering step, the partitioner uses simple "greedy" methods known in the art to lump related logic modules into slightly larger modules. These slightly larger modules are not further divided in subsequent steps, so that subsequent computationally intensive steps are run on fewer modules, thereby reducing the total time required to perform subsequent partitioning steps.

Figure 6:
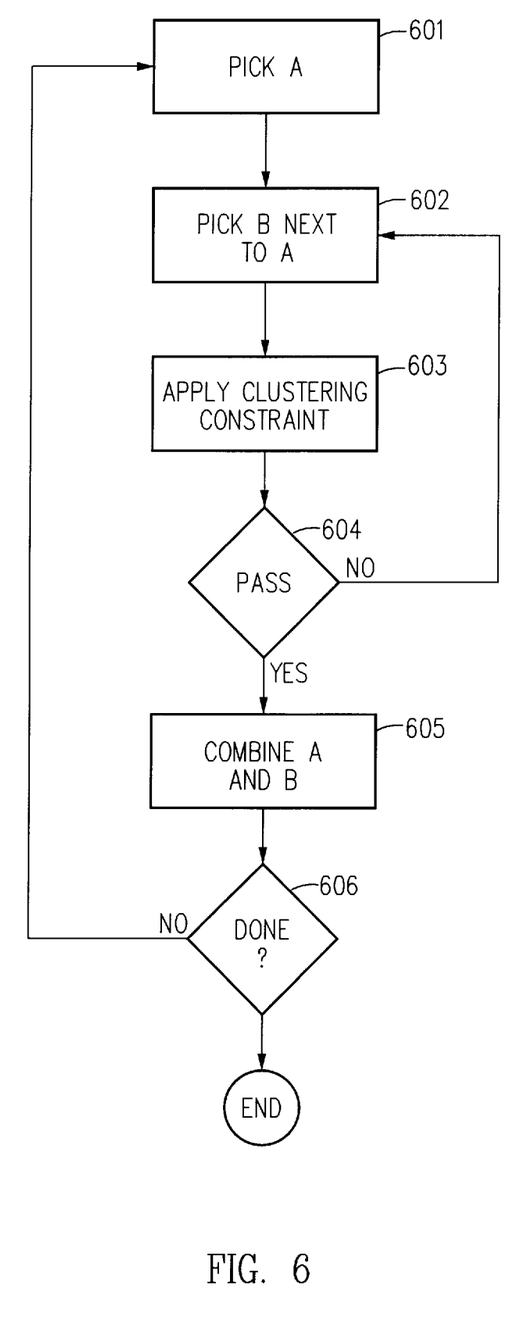
FIG. 6 is a flow diagram 600 for a preclustering method used in one embodiment of the present invention.

One method for performing the preclustering step is illustrated in FIG. 6. Initially, as shown in FIG. 6, at step 601, the logic circuit is grouped into small logic circuits ("modules"). (Each module can also be a primitive logic gate.) One such module is then randomly selected as a candidate for preclustering. This selected module is referred to as "module A" to facilitate reference in this discussion. Then, at step 602, each of the modules connected to module A are inspected, and a second module ("module B") is selected according to a selection criterion. In the present embodiment, the module selected to become "module B" is the module having the largest number of connections to module A.

Of course, other selection criteria can be substituted. For example, in another embodiment, module B is selected on the basis that, when combined with module A, the combined module's ratio of "virtual links" to the combined module's number of logic gates is a maximum. A virtual link exists when at least one connection exists between two modules. Thus, for example, a module providing an output signal to three different modules has three virtual links in that output signal. A module receiving one input signal from another module has one virtual link in that input signal. A module's total number of virtual links is the sum of the virtual links in all its input and output signals. If two modules have multiple connections for a given signal between them, only one virtual link is counted for the multiple connections.

After modules A and B are selected, a clustering constraint is applied at step 603. The clustering constraint ensures that the preclustering step does not produce modules that are too big to affect the flexibility in the subsequent partition step in constituting a single block. One such constraint that would limit the size of the combined module is given by:

$$G_i + cP_i \leq fG_{max}$$

where f is a heuristic factor between 0 and 1. A fan-out criterion to limit the number of fan-outs from the combined module can also be applied.

If the combined module satisfies the clustering constraint, modules A and B are combined at step 605. Otherwise, step 602 is repeated for the next module B candidate. The combined module is treated as a single module in all subsequent steps of the partitioner. Steps 601–605 are repeated until no further preclustering is possible, or until some target number of modules is reached.

Referring back to FIG. 5, following preclustering step 501, step 502 is a timing optimization step which attempts to combine modules in a critical signal path of the logic circuit into one module. A critical signal path is also known as a critical delay path. The goal of timing optimization is to avoid block crossings, i.e. placing modules in the critical signal path into different FPGAs. Block crossings increase undesirable signal delay because of the additional delay incurred by signals crossing FPGA boundaries. One method for timing optimization is described with reference to FIG. 7.

Figure 7:
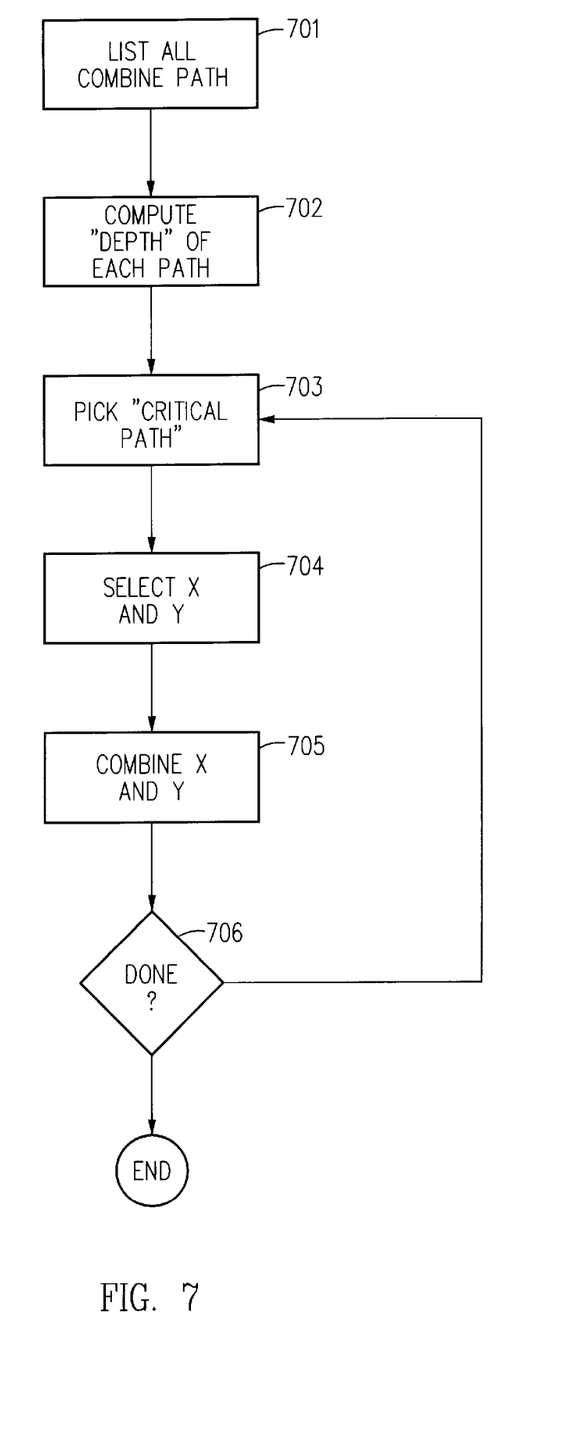
FIG. 7 is a flow diagram 700 for a timing optimization method used in one embodiment of the present invention.

As shown in FIG. 7, at step 701, all combinational signal paths in the logic circuit to be emulated are identified and listed. To accomplish step 701, each output terminal of a combinational signal path is traced back through combinational logic elements (e.g. logic gates, multiplexers, etc.) until an input terminal of a combinational signal path is reached. An output terminal of a combinational signal path is either an output terminal of the logic circuit to be emulated, or an input terminal of a storage element (e.g. a flip-flop or a latch). Similarly, an input terminal of a combinational signal path is either an input terminal of the logic circuit to be emulated, or the output terminal of a storage element.

Then, at step 702, the "depth" of each combinational signal path identified in step 701 is computed. The depth of a combinational signal path is simply the number of logic module crossings from the input terminal of the combinational signal path to the output terminal of the combinational signal path. A critical signal path, considered to be the combinational signal path with the greatest depth, is then identified at step 703. At step 704, a pair of connected modules, referred to in the following description as modules "X" and "Y" for convenience, is selected from the identified critical signal path.

A number of heuristic methods for selecting connected modules X and Y are possible. For example, one possible heuristic method selects the pair of connected modules in the critical signal path on the basis that the selected modules have the largest number of virtual links between them, and such that a cost function applied to module Z, the combination of modules X and Y, is less than some maximum cost. Such a cost function can take the form:

$$G_i + cP_i \leq fG_{max}$$

where $G_i$, $P_i$ are the gate cost of module Z and the number of pins of module Z, respectively; c is the cost per pin; and f is a weight between 0 and 1.

Alternatively, the head module (i.e. the module associated with the input terminal of the critical signal path) in the critical signal path and an immediately next module in the critical signal path can be selected. Similarly, the tail module (i.e. the module associated with the critical signal path) and the immediately preceding module in the critical signal path can be selected.

Then, at step 705, the modules X and Y are combined to form a new module. Steps 703–705 are repeated until the critical signal path falls below a predetermined depth value, or the cost of all modules in the critical signal path exceeds the maximum cost.

Referring back to FIG. 5, after the logic circuit has been "coarsened" by the preclustering and the timing optimization steps 501 and 502 into relatively large modules, circuit partitioning into blocks according to the partitioner's constraint begins at step 503. There are many techniques to perform partitioning step 503 known to those of ordinary skill in the art, including the well-known "Mincut" algorithm of Kernighan and Lin and its variations. One approach, known as "Flat Mincut", which is described in further detail below, divides the design initially into a fixed number (N) of blocks. The partitioner then successively improves the quality of this N-way split. Yet another approach uses a hierarchical scheme ("Hierarchical Mincut"), also described in further detail below, in which the Hierarchical Mincut scheme is recursively applied to a logic circuit to progressively divide the logic circuit into smaller blocks. In that embodiment, a logic circuit is first partitioned into two smaller blocks of roughly equal size, each block is then recursively partitioned into two even smaller blocks of roughly equal size. Termination occurs for each recursive application when the current two blocks satisfy the partitioner's constraint.

Figure 8A:
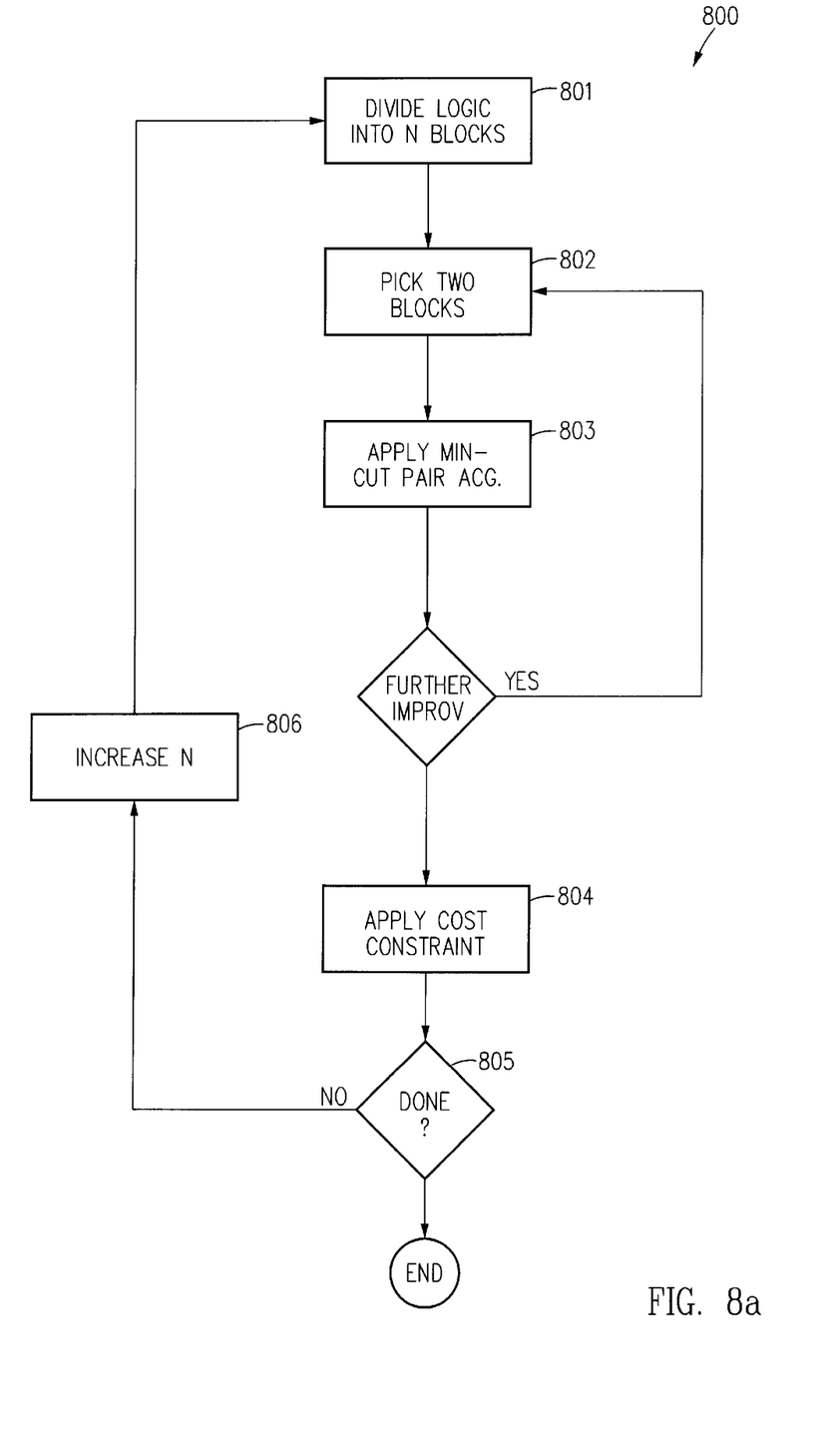
FIG. 8a is a flow diagram 800 summarizing a Flat Mincut method for logic circuit partition.

FIG. 8a is a flow diagram 800 summarizing the Flat Mincut method for the logic circuit partition step mentioned above. As shown in FIG. 8a, at step 801, the Flat Mincut method first randomly divides the input logic circuit into N blocks of roughly the same cost. In this context, the cost of a block i is given by the cost function C(i):

$$C(i) = G_i + cP_i$$

where $G_i$ is the total cost of all modules in block i, as expressed in gate equivalents[2]; $P_i$ is the number of virtual links that connect to block i; and c, as stated above is the cost of virtual link in gate equivalents. More precisely, $P_i$ is the weighted sum of pins in block i that connects block i to a different block. Each pin is weighted by the number of distinct blocks, other than block i, the pin connects.

[2] For example, the gate equivalent cost of an inverter can be assigned a value of 1, the gate equivalent cost of a two-input NAND gate can also be assigned a value of 1, and the cost of a 2-input AND gate be assigned a value 2.

Then, at step 802, two blocks are randomly selected. At step 803, an algorithm called "MincutPair" is applied to these two blocks. In order to facilitate the following discussion the selected pair of blocks are referred to as "block b1" and "block b2". The MincutPair algorithms moves selected modules in blocks b1 and b2 back and forth between each other, in order to achieve for each block a minimized cost. FIG. 8c is a flow diagram 860 showing the MincutPair method used in this Flat Mincut method. The goal of the MincutPair method is to redistribute modules in blocks b1 and b2, such that the sum of the costs of blocks b1 and b2 is minimized, and secondarily, such that b1 and b2 have roughly equal costs.

As shown in FIG. 8c, at step 861, the cost of each of blocks b1 and b2 is computed, in accordance with the cost function C(i) described above. As discussed above, the cost function C(i) includes the cost of virtual links. The calculation of virtual links may be complicated by multiple transitions on a given pin during a single user clock cycle. Such multiple transitions can occur when the logic circuit to be simulated is clocked by multiple clock signals, or when a pin is sampled at both the rising edge and the falling edge of a single user clock signal. For correct emulation, multiple transitions in a signal path must be faithfully reproduced in the virtual wires emulation system. To provide for multiple transitions, each pin that makes t transitions during a single user's clock period are further weighted by a factor of t. Thus, a pin connecting block i to b other blocks and which carries a signal making t transitions during a single user's clock period contributes a pin cost proportional to bt.

After computing the cost C(i) for each of blocks b1 and b2, at step 862, a quantity called "movegain" is computed for each module in block b1. Informally, the movegain for a module m in block b1 is the aggregate cost improvement for blocks b1 and b2 if module m is moved from block b1 to block b2. Cost improves when such movement of module m eliminates one or more connections between blocks b1 and b2. Note that movegain can be negative: i.e. the sum of the costs of blocks b1 and b2 can increase as a result of moving the module from one block to another.

Suppose the costs of block b1 and block b2 are c1 and c2, respectively, with module m residing in block b1, and suppose the costs of block b1 and block b2 are c1' and c2', respectively, after module m is moved from block b1 to block b2. Then, the movegain m(1,2) is given by:

$$m(1,2)=(c1+c2)-(c1'+c2')$$

Clearly, movegain m(1,2) need only be calculated incrementally, i.e. movegain m(1,2) need only be calculated for modules connected to module m, and therefore affected by the move of module m from block b1 to block b2. Of course, movegain m(1,2) must be computed using the virtual wire cost function C(i) discussed above.

After the movegains m(1,2) for all modules in block b1 having signals spanning blocks b1 and b2 are computed, at step 863, the module with the largest movegain is selected. At step 864, the selected module, i.e. the module with the largest movegain m(1,2), is moved from block b1 to block b2. Then, at step 864, the movegains for moving a module m from block b2 to block b1, i.e. m(2,1), for all modules in block b2 having a signal spanning the boundary of blocks b1 and b2 are computed. The method for computing these movegains m(2,1) is the same as discussed above for movegains m(1,2) with respect to step 862. Then, at step 866, the module with the largest movegain m(2,1) computed at step 865 is selected, and moved from block b2 to block b1 at step 867.

Steps 861 to 867 are applied to blocks b1 and b2 repeatedly until no further improvement of the total costs of blocks b1 and b2 are possible. The method represented in flow chart 860 is only one of many algorithms for finding the mincut between two blocks. Other approaches are also available to find the mincut between two blocks. These other approaches are also applicable to the present invention.

Referring back to FIG. 8a, after applying at step 803 the MincutPair algorithm to blocks b1 and b2 selected at step 802, steps 802 and 803 are repeated for a new randomly selected pair of blocks. Step 802 and 803 are repeated until the total cost of all N blocks is acceptably reduced or is not reduced further upon repeated applications of steps 802 and 803. At that point, at step 804, the cost of each block is tested against the cost constraint of the FPGA. The cost constraint is given by:

$$G_i+cP_i \leq G_{max}$$

If the cost of every one of the N blocks meets the combined cost constraint, the partition is complete; otherwise, at step 806, N is increased to allow a larger number of blocks to result, and steps 801 and 805 are repeated for this larger number of blocks. In one embodiment, N is doubled at step 806.

Figure 8B:
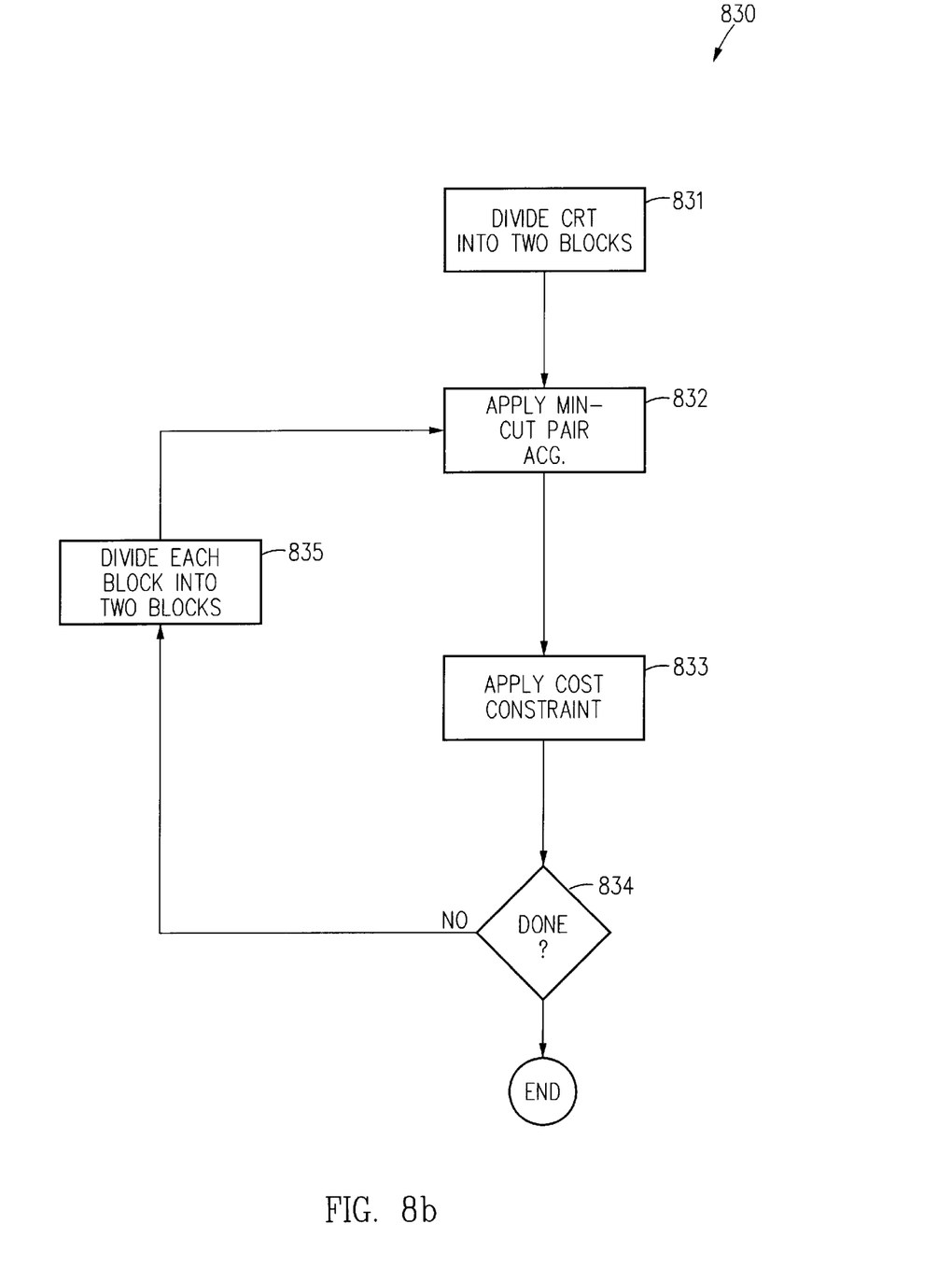
FIG. 8b is a flow diagram 830 summarizing a Hierarchical Mincut method for logic circuit partition.
Figure 8C:
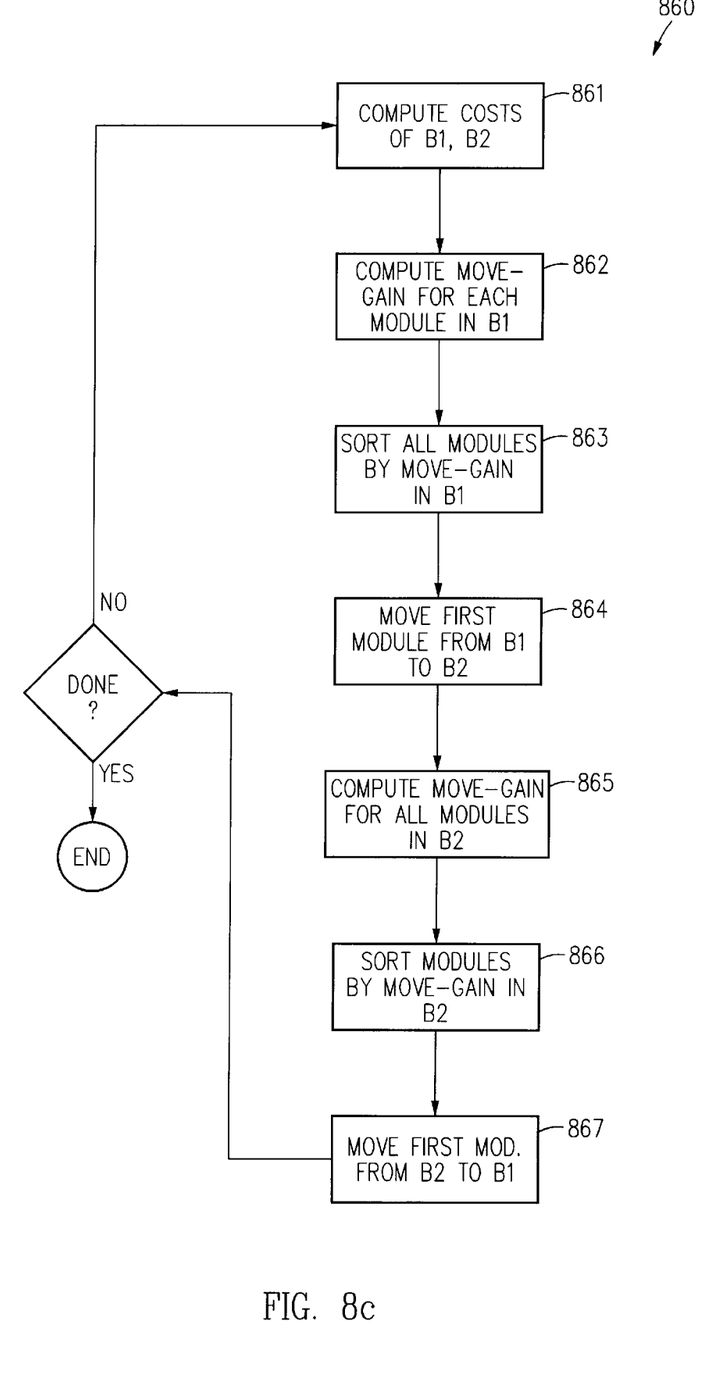
FIG. 8c is a flow diagram 860 showing the Mincut Pair method used in both the Flat Mincut method of FIG. 8a and the Hierarchical Mincut method of FIG. 8b.

Alternatively, partitioning can also be carried out using the "Hierarchical Mincut" algorithm illustrated in the flow diagram 830 of FIG. 8b. As shown in FIG. 8b, at step 861, the logic circuit to be emulated is first randomly divided into 2 blocks b1 and b2 of roughly equal costs. Then the MincutPair method of FIG. 8c is applied, at step 832, to these selected blocks b1 and b2. Then, at step 833, the cost of each block is tested against the partitioner's constraint:

$$G_i+cP_i \leq G_{max}$$

If both blocks meet the cost constraint, the partition is complete; otherwise the Hierarchical Mincut algorithm is recursively applied to each of the two blocks, i.e. steps 831–835 are applied to each of the two blocks.

One variation of the Hierarchical Mincut algorithm attempts, at step 835, to apply the Flat Mincut method of FIG. 8a on the logic circuit divided at step 831. In this variation, the Flat Mincut method divides the logic circuit of step 831 into three blocks. If the three blocks do not satisfy the cost constraint, then each of the two failed blocks at decision point 834 are recursively applied the Hierarchical Mincut method.

Referring back to FIG. 5, at step 504, after successfully partitioning the logic circuit to be emulated at step 503, the partitioner redistributes memories in the logic circuit among the partitioned blocks to increase the emulator's speed performance. Prior to step 504, memory components in the logic circuit are treated substantially the same way as logic modules. Memories have connections and they are also assigned gate-equivalent costs, typically in proportion to their number of address and data lines (e.g. the value of 4 gates can be assigned to each address or data line). As another example, a value c can be assigned to each address or data line of the memory, where c is the cost of a virtual link. However, if the emulator provides memory circuits, e.g. an SRAM integrated circuit, the memory components can be placed into the memory circuits, using a narrow path to an off-FPGA SRAM chip. Speed performance can be enhanced by minimizing the number of memory components configured in an FPGA. The partitioner's constraint is then checked one more time, at step 505, to ensure that each block so partitioned still satisfies the partitioner's constraint after memory optimization. If not, step 503 is applied on the failing block to obtain one or more smaller blocks meeting the partitioner's constraint. Alternatively, partitioning step 503 can be repeated for a larger number (>N) of initial blocks, if the Flat Mincut algorithm was used.

The above detailed description is provided to illustrate the specific embodiments of the present invention and is not intended to be limiting. Numerous variations and modifications within the scope of the present invention are possible.

For example, in the embodiments discussed above, the cost of a pin ($P_i$) is assumed fixed. However, the present invention is equally applicable when the pin cost varies for different pin types. At least four different approaches to variable cost pins are possible.

As a first variable cost pin approach, the costs of an input pin and an output pin can be different. For example, an input pin can be assigned a cost of four gates, while an output pin can be assigned a cost three gates. Thus, the cost function C(i) can be given as, for a circuit having $I_i$ input pins and $O_i$ output pins:

$$C(i) = G_i + c_{in}I_i + C_{out}O_i$$

where $c_{out}$ and $c_{in}$ are the costs of an output pin and the cost of an input pin, respectively.

The number of input pins and output pins are computed carefully. If, for a given net, an output signal b1 of block a is provided by block a once to each of b blocks, then block a incurs the total costs of b output pins. However, since each of the b blocks receives the signal bi only once, each of these b blocks, with respect to signal b1, incurs only a cost of one input pin.

As a second variable pin cost approach, a higher cost can be assigned to an output pin of the logic circuit driving a signal external to the emulated logic circuit, e.g. the user's target system. Similarly, as a third variable pin cost approach, if a pin connects modules in logic domains that are clocked by asynchronous clocks then that pin is an inter-domain pin, which can be assigned a higher cost.

As a fourth variable pin cost approach, an optimization called "fanout optimization" can be applied. In fanout optimization, variations in the number of virtual links of each block is kept to a minimum. In the virtual wire system discussed in the embodiments discussed in conjunction with FIGS. 5–7 and 8a–8c, the pin cost $P_i$ is weighted. For example, if an output pin for a given net on a block b1 drives input pins on blocks b2, b3, b4, and b5, then b2, b3, b4, and b5 are each charged the cost of one pin and b1 is charged the cost of four pins. Consequently, if block b1 has many output pins, then with respect to partition, the cost of block b1 may become unnecessarily large. One way to reduce this adverse impact on a single block is to restructure the logic circuit, such that selected recipients of an output signal retransmit the output signal received to other recipients in other blocks. In the above example, the logic circuit can be restructured such that block b1 sends the output signal to blocks b2 and b3. Then block b3, in turn, provides the output signal to blocks b4 and b5, respectively. In this manner, block b1 incurs only the costs of two pins, blocks b2 and b3 each incur the costs of two pins, and blocks b4 and b5 each incur the cost of one pin. Hence, no single block is significantly impacted.

Finally, an optimization called "vector constraint" can be used to provide a more detailed accounting for costs. For example, the partitioner's constraints discussed in the above embodiments can be further developed into a constraint encompassing independently different logic circuit components, such as gates, flip flops, memories, and internal nets. However, vector constraints complicate the partitioning process. Thus, the multi-dimensional cost constraint is best applied only at the final bounds check step.

I claim:

1. A method for emulating a logic circuit in a plurality of programmable logic devices, comprising the steps of:

partitioning a representation of said logic circuit into a plurality of logic blocks, in accordance with a single cost constraint, said cost constraint including functions of the number of logic gates and the number of pins of each logic, each logic block having a plurality of logic gates and a plurality of pins for connecting said logic block with other logic blocks in said plurality of logic blocks; and assigning each of said logic blocks to be implemented on one of said programmable logic device;

wherein said cost constraint is given by:

$$f(G_i, cP_i) \leq G_{max}$$

where $f$ is a function of the quantities $G_i$ and $cP_i$, $G_i$ being the number of logic gates in said logic block $G_{max}$ being said predetermined number of logic gates, c being a weighting factor expressing a cost of a pin in terms of a logic gate, and $P_i$ being the number of pins in said logic block.

2. A method as in claim 1, wherein said cost constraint compares a cost function against a predetermined number of logic gates, said cost function being, for each block, a function of the number of logic gates in said logic block and the number of pins in said logic block.

3. A method as in claim 1, wherein said cost constraint is given by:

$$G_i + cP_i \leq G_{max.}$$

4. A method as in claim 1, wherein said pins in said logic block include both input pins and output pins, and wherein said cost function assigns a first cost to each input pin and a second cost to each output pin.

5. A method as in claim 4, wherein said cost assigned to said output pin is proportional to the number of input pins coupled to said output pin outside of said logic block.

6. A method as in claim 1, wherein when a pin carries a signal making a plurality of transitions within a reference clock period, said pin contributes a cost to said cost function in proportion to said plurality of transitions.

7. A method as in claim 1 wherein, prior to said step of partitioning, said method includes the step of preclustering logic elements of said representation into clusters of logic elements, each cluster being formed in accordance with a cluster size constraint on a cluster function, said cluster size constraint being expressed in terms of a number of logic gates.

8. A method as in claim 7, wherein said cluster function comprises a fraction of said cost function.

9. A method as in claim 1 wherein, prior to said step of partitioning, said method includes the step of optimizing timing, said step of optimizing timing identifying critical signal paths in said logic circuit and grouping logic elements in said critical path into logic modules having pins of minimized costs.

10. A method as in claim 1, wherein, for each pin, said cost function associates a cost to said pin in proportion to the number of unique logic blocks to which said pin is connected.

11. A method as in claim 1, further including the step of restructuring logic elements associated with said pins to minimize fan-out for output pins among said pins.

12. A method as in claim 1, wherein said cost function is a function of two or more variables associated with the number of logic circuit elements in a logic block, said variables selected from the group of: (a) the number of logic gates in said logic block, (b) the number of flip-flops in said logic block, (c) the number of pins in said logic block, and (d) the number of memory elements in said logic block.

13. A method as in claim 12, wherein said cost function is expressed in terms of multiples of logic gates.

14. A method as in claim 12, wherein said cost function associates with each of said memory elements a cost expressed in logic gates.

15. A method as in claim 12, wherein said cost function associates with each of said memory elements a cost proportional to the number of address and data lines coupled to said memory element.

16. A method as in claim 12, wherein said cost function associates with each of said memory elements a cost $C(A,D)$ given by:

$$C(A,D) = nA + mD$$

where A and D are the number of address lines and the number of data lines coupled to said memory element, respectively, and n and m are constants.

17. A method as in claim 1, wherein said cost function assigns a higher cost to pins coupling said logic circuit to a circuit external to said logic circuit.

18. A method as in claim 1, wherein said logic circuit includes a number of timing domains, each timing domain receiving a different clock signal, said cost function assigning a different cost to pins connecting logic elements of different timing domains than pins connecting logic elements of the same timing domain.

19. A method as in claim 1, wherein said step of partitioning is performed in accordance with a flat mincut algorithm.

20. A method as in claim 1, wherein said step of partitioning is performed in accordance with a hierarchical mincut algorithm.

21. A method as in claim 20, wherein said hierarchical mincut algorithm applies a flat mincut algorithm to a given logic block not satisfying a termination constraint, prior to recursively applying said hierarchical mincut algorithm to portions of said given logic block.

22. A method as in claim 1 wherein said representation is a netlist representation.

* * * * *

UNITED STATES PATENT AND TRADEMARK OFFICE
CERTIFICATE OF CORRECTION

PATENT NO. : 5,854,752
ISSUE DATE : 12/29/98
INVENTOR(S) : Agarwal, Anant

It is certified that error appears in the above-identified patent and that said Letters Patent is hereby corrected as shown below:

Col. 11, line 9; New paragraph should begin at "The partioner's constraint..."

Signed and Sealed this

Tenth Day of April, 2001

*Attest:*

NICHOLAS P. GODICI

*Attesting Officer*     Acting Director of the United States Patent and Trademark Office